United States Patent [19]
Donnelly

[11] Patent Number: 4,881,237
[45] Date of Patent: Nov. 14, 1989

[54] HYBRID TWO-DIMENSIONAL SURFACE-EMITTING LASER ARRAYS

[75] Inventor: Joseph P. Donnelly, Carlisle, Mass.

[73] Assignee: Massachusetts Institute of Technology, Cambridge, Mass.

[21] Appl. No.: 237,149

[22] Filed: Aug. 26, 1988

[51] Int. Cl.[4] ................................................. H01S 3/19
[52] U.S. Cl. ........................................ 372/50; 372/34; 372/45; 372/48; 372/97
[58] Field of Search ............................. 372/50, 34–36, 372/45–49, 97, 23, 33, 43–44

[56] References Cited

U.S. PATENT DOCUMENTS

| | | | |
|---|---|---|---|
| 4,677,629 | 6/1987 | Lesh | 372/18 |
| 4,727,554 | 2/1988 | Watanabe | 372/34 |
| 4,730,325 | 3/1988 | Chow | 372/50 |
| 4,743,091 | 5/1988 | Gelbart | 350/252 |
| 4,760,578 | 7/1988 | Oshima et al. | 372/50 |
| 4,807,238 | 2/1989 | Yokomori | 372/36 |

FOREIGN PATENT DOCUMENTS

| | | | |
|---|---|---|---|
| 0040463 | 12/1970 | Japan | 372/50 |
| 0012181 | 1/1987 | Japan | 372/43 |

OTHER PUBLICATIONS

"High-Performance Heat Sinking for VLSI", Tuckerman et al., *IEEE Electron Device Letters*, vol. EDL-2, No. 5, May 1981, pp. 126–129.

"Surface-Emitting Two-Dimensional Laser Diode Arrays Constructed on Zig-Zag Heat Sink Surface", Sheem, S. K., Lawrence Livermore National Laboratory.

"Anisotropic Etching of Silicon", Bean, K. E., *IEEE Transactions on Electron Devices*, vol. Ed-25, No. 10, Oct. 1978, pp. 1185–1193.

"Optimal Structure of Microgrooved Cooling Fin for High-Power LSI Devices", Sasaki et al., *Electronics Letters*, Dec. 4, 1986, vol. 22, No. 25, pp. 1332–1333.

"Electron-Beam-Pumped Two-Dimensional Semiconductor Laser Array with Tilted Mirror Resonator", Tong et al., *Appl. Phys. Lett.* 52(16), Apr. 18, 1988, pp. 1303–1305.

"Optical I/O for High Speed CMOS Systems", Fried, J. A., *Optical Engineering*, Oct. 1986, vol. 25, No. 10, pp. 1132–1141.

Liau et al., *Appl. Phys. Lett.* 50, p. 528 (1987), "Large Monolithic Two-Dimensional Arrays of GaInAsP/InP Surface-Emitting Lasers".

"Monolithic GaAs/AlGaAs Diode Laser/Deflector Devices for Light Emission Normal to the Surface", Windhorn et al., *Appl. Phys. Lett.* 48 (24), Jun. 16, 1986, pp. 1675–1677.

"Angular Chlorine Ion-Beam-Assisted Etching of GaAs and AlGaAs", Goodhue et al., *Gallium Arsenide and Related Compounds* 1986, pp. 349–354.

"Monolithic Two-Dimensional Surface-Emitting Arrays of GaAs/AlGaAs Diode Lasers", Donnelly et al., *Appl. Phys. Lett.* 51(15), Oct. 12, 1987, pp. 1138–1140.

(List continued on next page.)

*Primary Examiner*—William L. Sikes
*Assistant Examiner*—Xuân Thi Vo
*Attorney, Agent, or Firm*—Hamilton, Brook, Smith & Reynolds

[57] ABSTRACT

Two-dimensional surface-emitting diode laser arrays are described that take advantage of both the advanced state of development of linear laser arrays with conventional cleaved end faces and the rapid development of Si heat sink technology. A hybrid array consists of linear arrays of edge-emitting lasers that are mounted in grooves with flat bottoms and 45° sidewalls etched in the top of a Si substrate containing microchannels for fluid flow on the backside. The 45° sidewalls of the top Si grooves are coated with a highly reflecting metallic layer. These 45° mirrors deflect the laser emission from the cleaved end faces of the linear laser arrays by 90° so the emission is normal to the array surface. Use of the integral microchannel heat sink in the bottom of the Si substrate provides excellent heat removal capabilities for high power density operation.

30 Claims, 3 Drawing Sheets

OTHER PUBLICATIONS

"Surface-Emitting GaAlAs/GaAs Linear Laser Arrays with Etched Mirrors", Yang et al., *Appl. Phys. Lett.* 49(18), Nov. 3, 1986, pp. 1138–1139.

Topical Meeting on Semiconductor Lasers, Technical Digest Series vol. 6, Feb. 10–11, 1987, pp. 79–109.

"High-Power, 8W CW, Single-Quantum-Well Laser Diode Array", Welch et al., *Electronics Letters,* Jan. 21, 1988, vol. 24, No. 2, pp. 113–115.

"Room-Temperature Pulsed Oscillation of GaAlAs/GaAs Surface Emitting Injection Laser", Iga et al., *Appl. Phys. Lett.* 45(4), Aug. 15, 1984, pp. 348–350.

"Two-Dimensional Array of GaInAsP/InP Surface-Emitting Lasers", Uchiyama et al., *Electronics Letters,* Feb. 14, 1985, vol. 21, No. 4, pp. 162–164.

"Distributed-Feedback, Surface-Emitting Laser Diode with Lateral Double Heterostructure", Ogura et al., *Electronics Letters,* Jul. 2, 1987, vol. 23, no. 14, pp. 758–760.

"A Novel Double-Heterostructure p-n-Junction Laser", A. J. Spring Thorpe, Applied Physics Letters, vol. 31, No. 8, Oct. 15, 1977, pp. 524–524.

Carlson et al., *Appl. Phys. Lett.* 50, 1301 (1987), "Phase-Locked Operation of a Grating-Surface-Emitting Diode Laser Array".

"Five Watt Continuous-Wave AlGaAs Laser Diodes", Harnagel et al., *Electronics Letters,* May 22, 1986, vol. 22, No. 11, pp. 605–606.

"2.4W CW, 770 nm Laser Arrays with Nonabsorbing Mirrors", Welch et al., *Electronics Letters,* May 7, 1987, vol. 23, No. 10, pp. 525–527.

"Ultra-High-Power Quasi-CW Monolithic Laser Diode Arrays with High Power Conversion Efficiency", Harnagel et al., *Electronics Letters,* Jul. 2, 1987, vol. 23, No. 14, pp. 743–744.

HYBRID TWO-DIMENSIONAL SURFACE-EMITTING LASER ARRAYS

GOVERNMENT SPONSORSHIP

This invention was made in the course of work supported by the Department of the Navy and Air Force under Contract No. F19628-85-C-0002.

TECHNICAL FIELD

This invention is in the field of semiconductors and, in particular, semiconductor laser devices.

BACKGROUND ART

Arrays of semiconductor diode lasers are of great interest for applications requiring higher power levels than can be attained with single devices. Development efforts to date have concentrated mainly on fabrication of linear arrays of edge-emitting GaAs/AlGaAs lasers.

Harnagel et. al., *Electron. Lett.* 22, 605 (1986) report formation of 5 Watt continuous-wave (CW) AlGaAs 1 mm laser diode bars in the form of monolithic 100 to 140 stripped linear arrays. Welch et al., *Electron. Lett.* 23, 525 (1987) present data on 770 nm, 10 stripe AlGaAs laser arrays with a 2.4 W CW output. Similar success is reported by Harnagel et al., in *Electron. Lett.* 23, 744 (1987) and Welch et al.. in *Electron. Lett.* 24, 113 (1988).

While these efforts have met with considerable success, a need for still higher power levels have led those skilled in the art, to attempt, along with continuing work on linear arrays, to achieve still higher output power by stacking and bonding these linear arrays to form composite two-dimensional arrays.

In the stacked and bonded array, linear diode laser arrays and slabs of electrical and heat conducting material forming individual heat sinks, are alternately stacked upon each other. The individual heat sinks are then thermally connected at their edges to a main heat sink from which the heat can be removed by several different techniques. In this arrangement, heat is transferred from the linear diode laser arrays into the individual heat sinks and then transversely along the individual heat sinks to the main heat sink. It is difficult to transfer heat from the linear laser arrays to the main heat sink and, thus, difficult to maintain temperature uniformity across the entire array. Microchannels, through which cooling fluid could be passed, could be incorporated in the individual heat sinks, but only with a significant increase in fabrication complexity.

As an alternate approach to such composite arrays, monolithic two-dimensional arrays consisting of surface-emitting lasers are also being investigated. Several types of surface-emitting GaAs/AlGaAs and GaInAsP-/InP diode lasers have been demonstrated. These include lasers with resonant cavities that are normal to the surface [Iga et al., *Appl. Phys. Lett.* 45, 348 (1984); Uchiyama et al., *Electron. Lett.* 21, 162 (1985) and Ogura et al., *Electron. Lett.* 23, 758 (1987)], lasers that incorporate a chemically etched 45° mirror [A. J. Spring Thorpe, *Appl. Phys. Lett.* 31, 524 (1979)], and lasers that utilize a second-order grating coupler to achieve emission normal to the surface [Carlson et al., *Appl. Phys. Lett.* 50, 1301 (1987)]. A second approach to the fabrication of monolithic two-dimensional arrays is to couple edge-emitting diode lasers with external mirrors that deflect the radiation from the laser facets by 90°. Liau and Walpole [*Appl. Phys. Lett.* 50, 528 (1987)] have fabricated such arrays of devices that combine a GaInAsP/InP laser with a parabolic deflector adjacent to one or both facets. The facets and deflectors were formed by selective chemical etching followed by a mass-transport process. Such a mass-transport process is not known for AlGaAs, and therefore, other techniques, such as ion-beam-assisted etching (IBAE) [Windhorn et al., *Appl. Phys. Lett.* 48, 1675 (1986); Goodhue et al., *Gallium Arsenide and Related Compounds* 1986, ed. W. T. Lindley (Inst. Phys. Conf. Ser. 83, Briston, 1987, p. 349; Donnelly et al., *Appl. Phys. Lett.* 51, 1138 (1987)] and ion milling [Yang et al., *Appl. Phys. Lett.* 49, 1138 (1986)] have been used to form the noncleaved laser facets and adjacent deflectors. Monolithic two-dimensional GaAs/AlGaAs diode laser arrays, in which all of the facets and deflectors were formed by IBAE, have recently been reported by Donnelly et al., above. Although these monolithic techniques hold great promise for large-area high-power laser arrays, they are still in the early stages of development. In some of them, the quality of the mirrors and windows are not as good as the conventional cleaved facets found in linear arrays.

DISCLOSURE OF THE INVENTION

In the present invention, a hybrid approach to two-dimensional surface-emitting diode laser arrays is provided that takes advantage of both the advanced state of development of linear laser arrays with conventional cleaved end facets and the rapid development of microchannel heat sink technology.

In accordance with the present invention, a high power CW, or high average power pulsed array, consisting of linear arrays of edge-emitting lasers mounted in grooves formed in substrates, is formed. The substrates are formed of material with good heat conduction properties, such as Si or Cu. The grooves have flat bottoms and 45° sidewalls forming reflective mirrors. In one embodiment, the grooves and sidewalls are etched into a Si substrate containing microchannels for cooling fluid flow.

BEST MODE OF CARRYING OUT THE INVENTION

Figure 1:
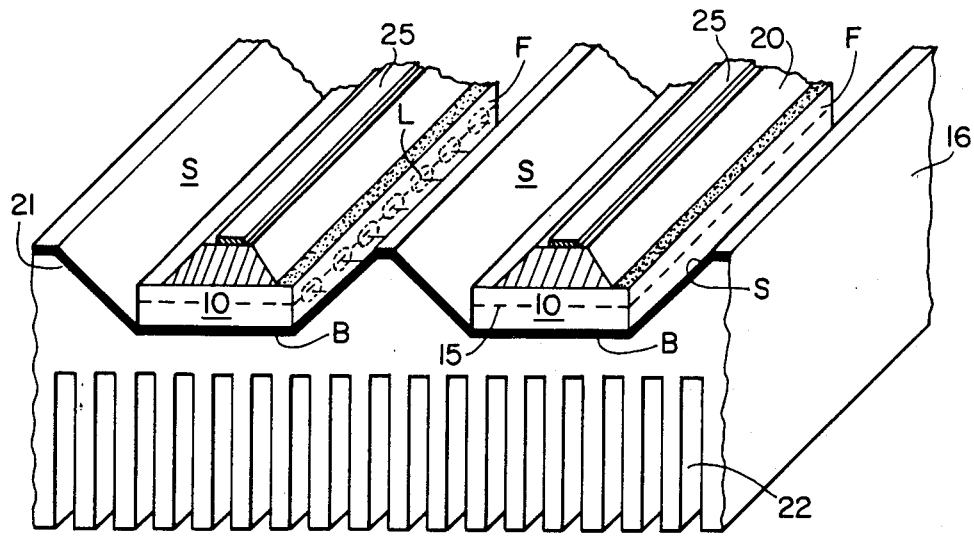
FIG. 1 is a perspective view of a portion of a preferred embodiment of a hybrid two-dimensional surface-emitting diode laser array of the invention, showing two linear laser diode arrays. In this embodiment, the linear laser arrays are connected in parallel through the highly conducting Si substrate.
Figure 4:
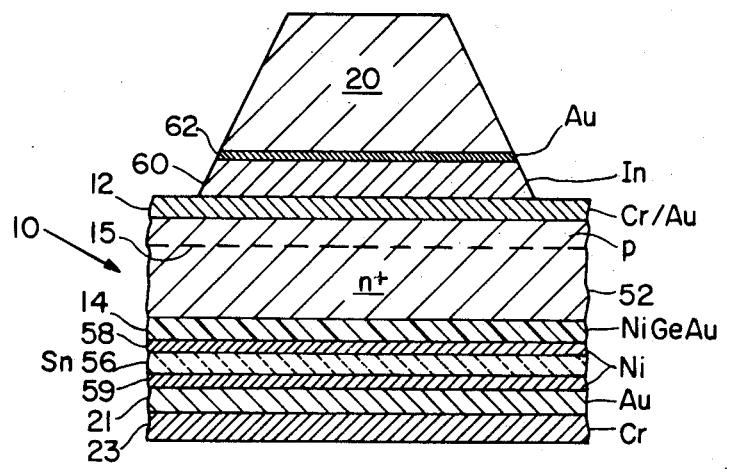
FIG. 4 is a detailed cross-sectional view of a linear laser diode array 10 of the structure of FIG. 1 showing the metallization and soldering layers for mounting the array to the substrate.

Referring now to FIGS. 1 and 4 of the drawings, the invention will be described in detail.

In the embodiment shown in FIG. 1, a series of linear arrays of gallium arsenide/aluminum gallium arsenide diode lasers 10 with conventional cleaved end facets F are mounted on grooves etched in a silicon substrate 16. The grooves have flat bottom walls B and 45° sidewalls S. The sidewalls are coated with a highly reflecting layer of, for example, gold 21 on a chromium adhesion layer 23.

The flat-bottom grooves are etched in a (100) Si wafer 16 by means of standard photolithography and an orientation-selective etch. A stripe pattern oriented in a (013) direction is first defined in a $Si_3N_4$ capping layer (not shown) that serves as an etch mask. The Si is then etched in a suitable solution, such as, a KOH-isopropanol-$H_2O$ solution at 80° C. The bottom (100) Si plane etches about 2.5 times faster than the (331) sidewalls. The bottom is flat and parallel to the top surface and the sidewalls are inclined at an approximately 45° angle from the bottom surface. Since the etch rate ratio is only 2.5, the actual angles between the sidewalls and the top and bottom are closer to 45° than to the theoretical angle of 46.5° between (331) and (100) planes. In an experimental prototype, the grooves were about 210 $\mu$m deep with 400-$\mu$m wide bottoms. It should be noted that grooves with wider bottoms can be used and are preferable so that linear laser arrays with larger cavity lengths can be used. After etching, the surface of the Si wafer is metallized with Cr under Au to form the reflecting surface 21.

The linear arrays 10 are preferably fabricated from a GaAs/AlGaAs wafer containing a single quantum well symmetrically positioned in a large optical cavity. Organometallic vapor-phase epitaxy is used to grow the following epitaxial layers on a Si-doped n+-GaAs substrate misoriented 2° off the (100) towards (011): 1.8-$\mu$m n+-$Al_{0.6}Ga_{0.4}As$ confinement layer, 0.32-$\mu$m n-$Al_{0.3}Ga_{0.7}As$ guiding layer, 0.02-$\mu$m undoped GaAs active layer (shown by dotted line 15 in FIGS. 1 and 2), 0.32-$\mu$m p-$Al_{0.3}Ga_{0.7}As$ guiding layer, 1.5-$\mu$m p-$Al_{0.6}Ga_{0.4}As$ confinement layer and 0.2-$\mu$m p-$Al_{0.6}Ga_{0.4}As$ confinement layer and 0.2-$\mu$m p+-GaAs contacting layer. The two 0.32-$\mu$m $Al_{0.3}Ga_{0.7}As$ layers on either side of the active layer 15 form the large optical cavity. With the exception of the substrate 52 and active layer 15, the remaining layers are not shown in FIG. 4 in order to simplify the drawing. The designation p above the dotted line 15 of FIG. 4 denotes the p-doped guiding confinement and contact layers located, in general, above the undoped gallium arsenide active layer 15.

Following the deposition of a top ohmic contact layer 12 of Cr/Au (FIG. 4), 40-$\mu$m-wide stripe lasers on 250-$\mu$m centers are defined by a proton bombardment penetrating to a depth approximately 0.2 $\mu$m above the top of the p-$Al_{0.3}Ga_{0.7}As$ layer. A second proton bombardment at higher energies is performed to introduce sufficient optical loss in 10-$\mu$m stripes midway between the lasers to suppress lasing in the transverse direction. Next, the wafer is thinned to about 75 $\mu$m, and a bottom ohmic contact 14 of Ni/Ge/Au is made to a n+-GaAs substrate 52. The upper and lower contacts 12 and 14 are then subjected to a heat treatment to microalloy the contacts. Linear arrays 10 with 400-$\mu$m-long laser cavities are then cleaved from the wafer. For long-lifetime, high-power operation, appropriate coatings (not shown), such as $Al_2O_3$, are then applied to the cleaved facets F. Several arrays, made as above, were tested using 100-ns current pulses at a repetition rate of 1 kHz.

The average threshold current per 40-$\mu$m-wide stripe laser was typically about 120 mA, and the measured differential quantum efficiencies per facet were consistently greater than 30%. The cone angle of the laser emission, shown in dotted lines L (full width at half maximum) in the vertical direction, was about 40°.

Several linear arrays, approximately 4 mm wide, each containing 15 or 16 lasers (7 of which are shown by the oval dotted lines L of FIG. 1), were mounted in the metallized grooves etched in Si substrate 16 by bonding the bottom Ni/Ge/Au contact 14 to the Au/Cr coating 21/23 on the Si substrate 16 using Sn solder 56 sandwiched between two nickel barrier coatings 58 and 59. Cu electrical conducting bars 20 are then soldered with indium/gold 60/62 to the top of the linear laser arrays 10. A high electrical conductivity material is important to minimize the voltage drop along the Cu bar. The sidewalls of the copper bars 20 should be tapered, as by angle etching, to prevent some of the light reflected from the reflecting mirrors being blocked as it radiates from the surface S of the array. Optional copper interconnecting bars or wires 25 are bonded to the CU conducting bars 20 for connecting the individual arrays together.

Figure 3:
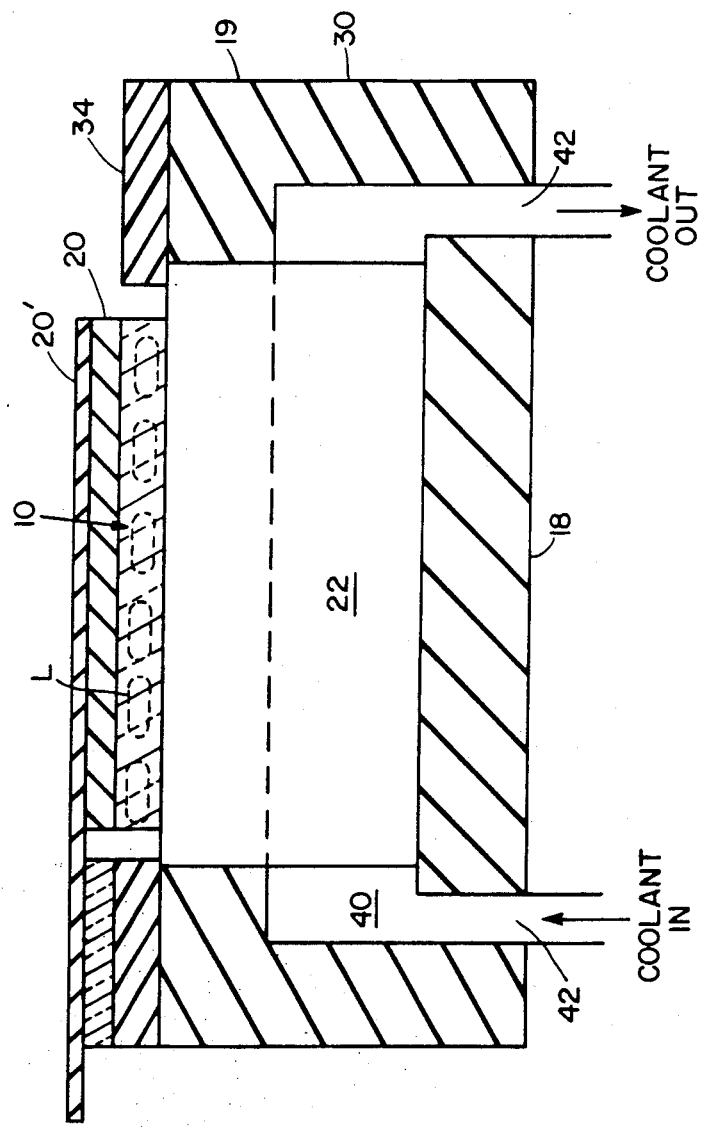
FIG. 3 is a schematicized cross-sectional view illustrating details of the housing and cooling apparatus for the devices of FIGS. 1 and 2.

For high power density applications, a microchannel heat sink is incorporated into the Si substrate 16 by forming microchannels 22 in the bottom of the Si substrate. The hybrid array with microchannels is then mounted in a housing 30 (FIG. 3) formed of side-walls 19, top wall 34 and bottom wall 18. Coolant 40, such as water or an ethylene-glycol water mixture is introduced into the channels for flow past the arrays and out through openings 42 in the bottom wall 18 of housing 30.

The linear diode laser arrays 10 can be operated in series, rather than parallel, by electrically isolating the arrays from the substrate. Preferably, in this series embodiment, shown in FIG. 2, n-p isolation junctions 17 are formed in a p-Si substrate by selectively n-type doping the p-Si substrate 16 in the region 19 beneath the bottom flat surface B of the grooves and beneath the 45° reflecting mirror metallization 21. In this case, the Cr/Au reflecting mirrors must not be continuous across the flat top of the mesas. Alternatively, isolation may be achieved by using high resistivity $\geq 100\Omega$-cm Si. The linear laser arrays 10 are indium soldered to a bottom Cu contacting pedestal bar 64 and a top Cu contacting bar 20' and the entire structure, consisting of bottom Cu conducting bar 64, linear laser array 10 and top conducting bar 20', indium soldered to the bottom of the grooves in the Si substrate. Copper interconnecting bars or wires 25 are bonded to the Cu contacting bars 20', 64 in such a way as to connect the linear laser arrays 10 in series, i.e., the lower contact bar 64 of one array is connected to the upper contact bar 20' of the next adjacent array.

Figure 2:
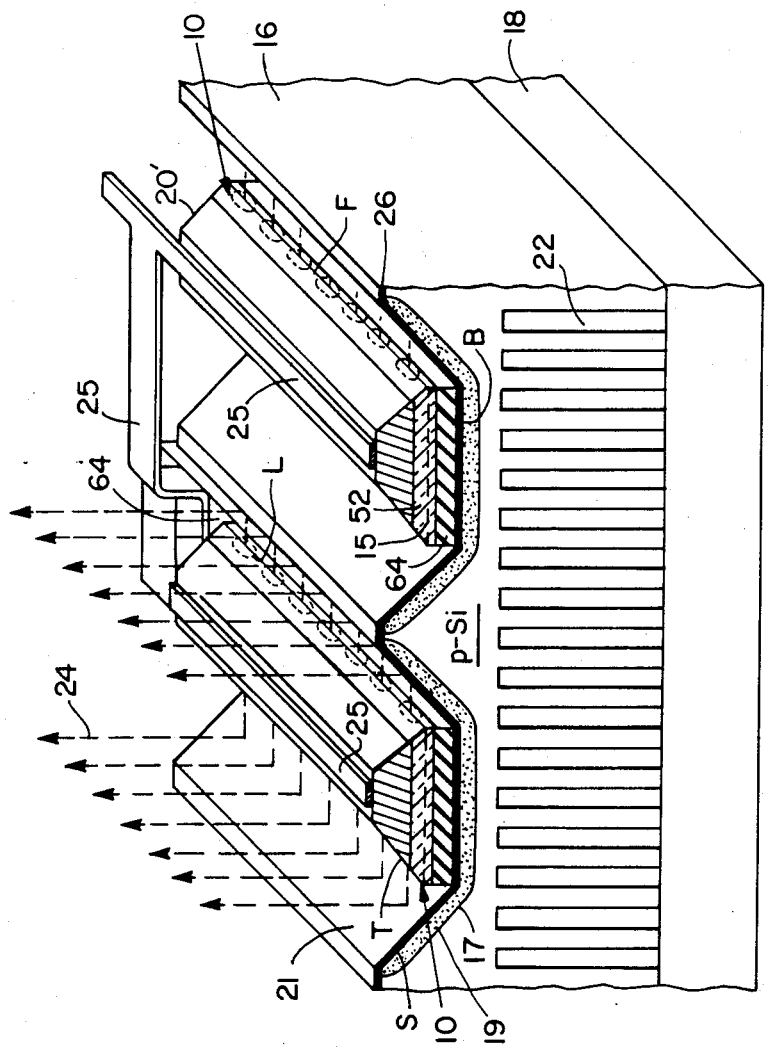
FIG. 2 is a perspective view of a portion of another embodiment of a hybrid two-dimensional surface-emitting diode laser array 10 of the invention, showing two linear laser arrays. In this embodiment, the linear laser arrays are mounted junction side down and are connected in series.

The series connected embodiment of FIG. 2 reduces total current requirements, as compared to the parallel connected structure of FIG. 1. By alternately interconnecting the top bars to the bottom bars from one end of the laser arrays to the other, the voltage drop across each laser array is made uniform and, therefore, the current through each laser is also more uniform compared to the parallel connected structure.

Note that in the series connected embodiment shown in FIG. 2, the laser arrays are shown with the "junction side down", i.e., the active region 15 shown in dotted lines, is nearer the bottom and the substrate side of the linear array is on top. This is made possible by either (a) mounting the arrays on a copper bar pedestal 64, as indicated in FIG. 2; and/or (b) tapering the sidewalls of the copper bar 20' and the laser array substrate 52 below the active region to prevent light reflected from surface S being blocked as it radiates (as also shown in FIG. 2). Mounting the junction side down is preferably for heat removal. Optimum heat removal is obtained by tapering the back of the laser diode arrays and mounting the arrays junction side down directly on an electrically conducting heatsink and operating them in parallel. Tapering of the substrate 52 is accomplished by selectively etching grooves in the back of the laser wafer before cleaving.

Equivalents

This completes the description of the preferred embodiment of the invention. It will be apparent to those skilled in the art, without departing from the invention in its broader aspects, to devise equivalents thereto. For example, the substrate may be formed of materials other than Si, such as copper, for its thermal conductivity properties. However, Si is advantageous in many applications, because diode laser arrays can be "hard" soldered to it; whereas laser arrays must usually be soldered to copper with In, a "soft" solder. In general, any laser arrays formed of any known material, i.e., from the conventional III-V materials or alloys thereof, to the more exotic semiconductor lasing devices formed from lead (Pb)-salts or II-VI materials, may be utilized. Other laser array structures and fabrication techniques are contemplated. For example, the transverse gain guided structures, shown, may be replaced by index guided structures. Arrays, 1 cm or more, in place of the 4 mm array width illustrated in FIG. 1, would be employed in high power arrays. Optically pumped laser arrays may be substituted for the electrically driven laser diode arrays illustrated. In place of Cu or Si, an array substrate of beryllium oxide (BeO), which is an electrical insulator and a good thermal conductor, may be employed.

Accordingly, the invention is not intended to be limited, except as required by the scope of the following claims and equivalents thereof:

I claim:

1. A hybrid laser array comprising:
   (a) an array substrate having a plurality of longitudinally extending grooves formed on a surface thereof with each groove comprised of a pair of inclined light reflective walls extending toward each other and terminating on a flat surface; and
   (b) a linear array of laser edge emitting devices mounted in each groove, each laser device being formed with a region of light emitting material located within a resonant optical cavity formed between two electrodes for emitting laser light for reflection off the reflective surface of said light reflective walls.

2. The array of claim 1 wherein the array substrate has channels formed therein beneath and along the length of the grooves for flowing coolant therethrough to remove heat from arrays mounted in said grooves.

3. The array of claim 1 wherein the electrodes are formed by ohmic contacts which are formed along the length of opposed first and second surfaces of each linear laser array extending in parallel relation to the plane of said longitudinally extending grooves and these arrays are connected in series by electrically coupling the first surface of one array to the second surface of the next adjacent array.

4. The array of claim 1 wherein the array substrate is formed from n-type silicon.

5. The array of claim 4 wherein a p-type region is formed in said n-type Si in the regions of said n-type Si adjacent the flat surface of said grooves for electrically isolating the laser diode laser arrays.

6. The array of claim 1 wherein the substrate is formed of p-type silicon.

7. The array of claim 6 wherein an n-type region is formed in said p-type silicon in the regions of said p-type silicon adjacent the flat surface of said grooves for electrically isolating the laser diode laser arrays.

8. The array of claim 1 wherein the angle of inclination of said inclined walls is about 45°.

9. The array of claim 1 where the linear array laser edge emitting devices have an active layer formed over a device substrate and are mounted in the grooves in the array substrate with the device substrate in closer proximity to the flat groove surfaces than the active layer.

10. The array of claim 1 wherein the linear array laser edge emitting devices are formed on a relatively thick device substrate with an active layer of semiconductor material formed over the device substrate and the arrays are mounted in the grooves in the array substrate with the active layer in closer proximity to the flat groove surface than the device substrate.

11. The array of claim 1 wherein the array substrate is formed of Si.

12. The array of claim 1 wherein the array substrate is formed of copper.

13. The array of claim 1 where the array substrate is BeO.

14. The array of claim 11 wherein the linear array is formed of GaAs.

15. The array of claim 1 wherein the devices are mounted on a pedestal within the grooves.

16. A two-dimensional surface-emitting laser array comprising:
   (a) an array substrate formed of high thermal conductivity, etchable material having a plurality of longitudinally extending grooves formed on a surface thereof with each groove comprised of a pair of inclined walls with metallic light reflective coating thereon, said inclined walls extending toward each other and terminating on a flat array substrate surface; and
   (b) a linear array of laser edge emitting devices with a flat broad surface mounted in each groove, each laser device being formed with a region of light emitting material disposed within a resonant optical cavity formed between two electrodes for emitting laser light for reflection off an inclined wall so that laser emission from said linear array is reflected normal to the flat broad array surface.

17. The array of claim 16 wherein the array substrate is Si and has channels formed therein beneath and along the length of the grooves for flowing coolant therethrough to remove heat from arrays mounted in said grooves.

18. The array of claim 16 wherein ohmic contacts are formed along the length of opposed first and second surfaces of each array in parallel relationship to the flat broad surface of said grooves and the arrays are electrically connected in series by electrically coupling the first surface of one array to the second surface of the next adjacent array.

19. A method of forming a two-dimensional surface-emitting laser array comprising the steps of:
(a) forming in a silicon wafer a plurality of spaced apart adjacent flat bottom grooves with 45° sidewalls extending toward each other and terminating at said flat bottom;
(b) coating the sidewalls with a light reflective material;
(c) bonding edge emitting linear laser arrays formed of laser devices each having a strip of light emitting material with edges at each end formed within a resonant optical cavity formed between two electrodes for emitting light from said edges to the flat bottoms of the grooves, wherein said arrays are arranged such that laser radiation emitted from said edges is reflected off said sidewalls.

20. In a two-dimensional surface-emitting laser array the improvement comprising:
(a) a plurality of linear diode laser arrays with cleaved facets from which laser radiation is emitted;
(b) a heat conducting substrate having grooves formed therein in which said arrays are mounted and from which said laser radiation is emitted in two dimensions.

21. The array of claim 20 wherein the grooves are formed adjacent each other and each groove has a flat planar surface and 45° light reflective sidewalls which extend toward each other and terminate at said flat surface with said arrays being mounted on said planar surface so that laser radiation from said facets reflects off said sidewalls.

22. In a method of forming a two-dimensional surface-emitting laser array the improvement comprising:
(a) forming a plurality of linear diode laser arrays with cleaved facets from which laser radiation is emitted;
(b) forming grooves with angled sidewalls in a high thermal conductivity substrate;
(c) mounting said linear arrays in said grooves such that the laser radiation is emitted in two dimensions.

23. The array of claim 22 wherein the substrate is formed of p-type silicon.

24. The array of claim 23 wherein the grooves have sidewalls terminating at a flat surface and an n-type region is formed in said p-type silicon in the region of said p-type silicon adjacent the flat surfaces of said grooves for electrically isolating the array.

25. The array of claim 23 wherein the grooves comprise inclined sidewalls and a flat bottom surface with the angle of inclination of said inclined walls being about 45° and the sidewalls extend toward each other and terminate at said bottom surface.

26. The array of claim 19 wherein the edge emitting lasers are formed on a relatively thick device substrate with an active layer of semiconductor material formed over the device substrate and the array is mounted in the groove in the wafer with the active layer in closer proximity to the flat groove surface than the device substrate.

27. The array of claim 16 wherein the array substrate is formed of Si.

28. The array of claim 16 wherein the array substrate is formed of copper.

29. The array of claim 10 in which the linear arrays are bonded between two electrically conducting bars forming a sandwich and each entire sandwich, consisting of top conducting bars, linear laser arrays and bottom conducting bar is placed in an array substrate groove and the top conducting bar of one sandwich is coupled to the bottom conducting bar of an adjacent sandwich to operate the laser linear arrays in series.

30. The array of claim 10 in which each of the arrays is bonded to electrically conducting pedestals between the flat groove surface and the devices.

* * * * *